United States Patent [19]
Landy et al.

[11] Patent Number: 5,508,756
[45] Date of Patent: Apr. 16, 1996

[54] T.V. SIGNAL TUNER IN A TAPE CASSETTE BODY AND METHOD THEREFOR

[76] Inventors: Bruce Landy, 3840 N. 51st Ave., Hollywood, Fla. 33021; Bradford Landy, 8750 Royal Palm Blvd., Coral Springs, Fla. 33065

[21] Appl. No.: 385,352

[22] Filed: Feb. 8, 1995

[51] Int. Cl.⁶ .................................... H04N 5/44
[52] U.S. Cl. ............................ 348/725; 348/731
[58] Field of Search .................... 348/725, 731, 348/738; 358/341; 439/639; 381/86

[56] References Cited

U.S. PATENT DOCUMENTS

| | | | |
|---|---|---|---|
| 3,569,839 | 3/1971 | Dyer | 325/396 |
| 4,064,374 | 12/1977 | Sato | 179/100.11 |
| 4,109,115 | 8/1978 | Yamamoto | 179/100.11 |
| 4,109,988 | 8/1978 | Olson | 339/91 R |
| 4,119,813 | 10/1978 | Sato | 179/100.11 |
| 4,199,724 | 4/1980 | Kondo | 455/344 |
| 4,210,094 | 7/1980 | Kondo | 116/255 |
| 4,233,606 | 11/1980 | Chernoff | 343/100 |
| 4,419,749 | 12/1983 | Nokihara et al. | 369/11 |
| 4,488,273 | 12/1984 | Nokihara et al. | 369/11 |
| 4,593,331 | 6/1986 | Tomita | 360/93 |
| 4,712,250 | 12/1987 | Michels | 455/20 |
| 4,734,897 | 3/1988 | Schotz | 381/86 |
| 4,742,393 | 5/1988 | Sugai | 358/188 |
| 4,803,560 | 2/1989 | Matsunaga | 358/236 |

Primary Examiner—Victor R. Kostak
Assistant Examiner—R. Brian Johnson
Attorney, Agent, or Firm—Robert C. Kain, Jr.

[57] ABSTRACT

The present invention relates to a T.V. tuner cassette insertable into a tape player. These tape players (or recorders) normally have magnetic pick-up heads, volume controls and other signal conditioning circuitry which collect and modify an audio signal prior to application of the audio signal to one or more speakers. The T.V. tuner cassette demodulates the audio components of the received T.V. signal and applies the demodulated audio component to the electronic circuitry in the tape player by an inductive or an electromagnetic link established with the magnetic pick-up head in the tape player and an inductive transmitter in the T.V. tuner cassette. The T.V. tuner cassette is powered from a power cable extending beyond or outboard of the tape player. The power cable, at its remote end, terminates in a cigarette lighter adapter plug. This plug fits into a standard cigarette lighter outlet. Mounted on the cigarette lighter adapter plug is a tuner control such that a user can select a T.V. broadcast signals by actuating or rotating the tuner control. In addition, the power cord may include or carry an antenna for the T.V. tuner cassette. A method of detecting and reproducing the audio component of a T.V. signal is also included.

6 Claims, 5 Drawing Sheets

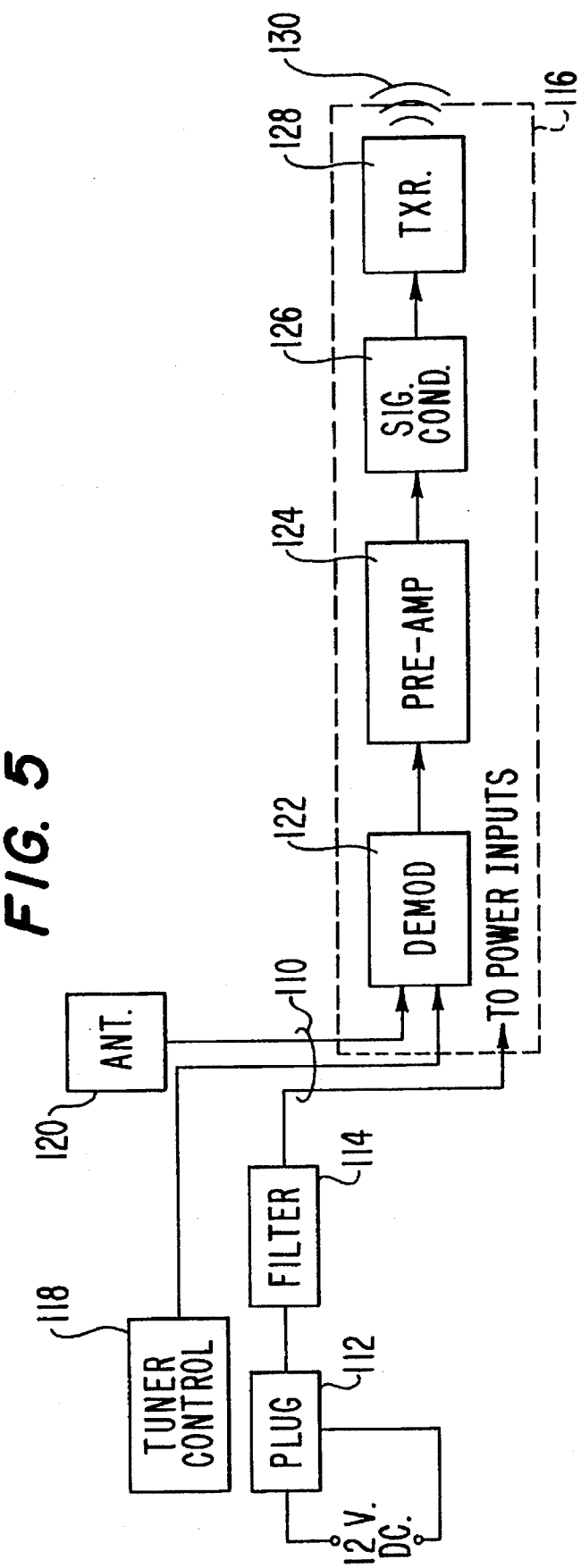

T.V. SIGNAL TUNER IN A TAPE CASSETTE BODY AND METHOD THEREFOR

BACKGROUND OF THE INVENTION

The present invention relates to a television (T.V.) signal tuner, capable of demodulating the audio component of the T.V. signal, encased within a tape cassette player and a method therefor.

U.S. Pat. Nos. 4,488,273 and 4,419,749 to Nokihara discloses a radio tuner insertable in a tape cassette player. A tuner dial extends slightly above one planar face of the radio tuner cassette casing. Power and detected AM/FM radio signals are exchanged via pins protruding from a rear backside planar face of the radio timer cassette casing. The magnetic detection head of the tape cassette player is electromagnetically isolated from the tuner cassette by shielding.

U.S. Pat. No. 4,593,331 to Tomita discloses a radio tuner cassette insertable into a tape cassette player. A dial protrudes from an opening in the tape player casing. No details are provided regarding the exchange of power and AM/FM radio signals between the radio tuner cassette and the tape player.

U.S. Pat. No. 4,119,813 to Sato discloses a tape player which has a planar end face with a coupling surface to enable electrical and physical attachment to a rectangular radio tuner. The radio tuner is affixed to the tape player via a screw and bolt combination. Electrical connections are provided by pins and pin receptors on the respective coupling surfaces of the tape player and the tuner casing.

U.S. Pat. No. 4,210,094 to Kondo and U.S. Pat. No. 4,199,724 to Kondo and U.S. Pat. No. 4,064,374 to Sato disclose radio tuners and tape player combinations similar to U.S. Pat. No. 4,119,813 to Sato.

U.S. Pat. No. 4,803,560 to Matsunaga discloses a combination radio tuner/tape player/television receiver. The television screen is disposed over the tape cassette insertion region.

U.S. Pat. No. 4,109,115 to Yamamoto discloses a radio and television signal receiver and tape recorder apparatus. The audio portions of the received television signals can be recorded on tape.

OBJECTS OF THE INVENTION

It is an object of the present invention to provide a T.V. signal demodulator, disposed within a case the size and shape of a standard tape cassette, which demodulates and preamplifies the audio component of the received T.V. signal.

It is a further object of the present invention to transfer the demodulated T.V. signal from the T.V. tuner cassette to the tape player via an inductive e.m.f. link established with the magnetic pick-up head in the tape player.

It is another object of the present invention to provide power to the T.V. tuner cassette via a cigarette lighter outlet.

It is another object of the present invention to provide a tuner control mounted on the cigarette lighter adaptor plug to enable the user to select one of the plurality of T.V. broadcast signals.

It is an additional object of the present invention to provide a combination power and tuner control cable extending from the cigarette lighter plug/tuner control to the inserted T.V. tuner cassette.

It is an additional object of the present invention to include an antenna within the combination power and control cable.

SUMMARY OF THE INVENTION

The present invention relates to a T.V. tuner cassette insertable into a tape player. These tape players (or recorders) normally have magnetic pick-up heads, volume controls and other signal conditioning circuitry which collect and modify an audio signal prior to application of the audio signal to one or more speakers. The T.V. tuner cassette demodulates the audio components of the received T.V. signal and applies the demodulated audio component to the electronic circuitry in the tape player by an inductive or an electromagnetic link established with the magnetic pick-up head in the tape player and an inductive transmitter in the T.V. tuner cassette. The T.V. tuner cassette is powered from a power cable extending beyond or outboard of the tape player. The power cable, at its remote end, terminates in a cigarette lighter adapter plug. This plug fits into a standard cigarette lighter outlet. Mounted on the cigarette lighter adapter plug is a tuner control such that a user can select a T.V. broadcast signals by actuating or rotating the tuner control. In addition, the power cord may include or carry an antenna for the T.V. tuner cassette. A method of detecting and reproducing the audio component of a T.V. signal is also included.

BRIEF DESCRIPTION OF THE DRAWINGS

Further objects and advantages of the present invention can be found in the detailed description of the preferred embodiments when taken in conjunction with the accompanying drawings in which:

FIG. 5 is a block diagram showing the major electronic and electrical components of the T.V. tuner cassette invention;

DETAILED DESCRIPTION OF THE PREFERRED EMBODIMENT

The present invention relates to a television (T.V.) tuner cassette which is insertable into a tape player and which demodulates the audio component of a received T.V. signal.

Figure 1:
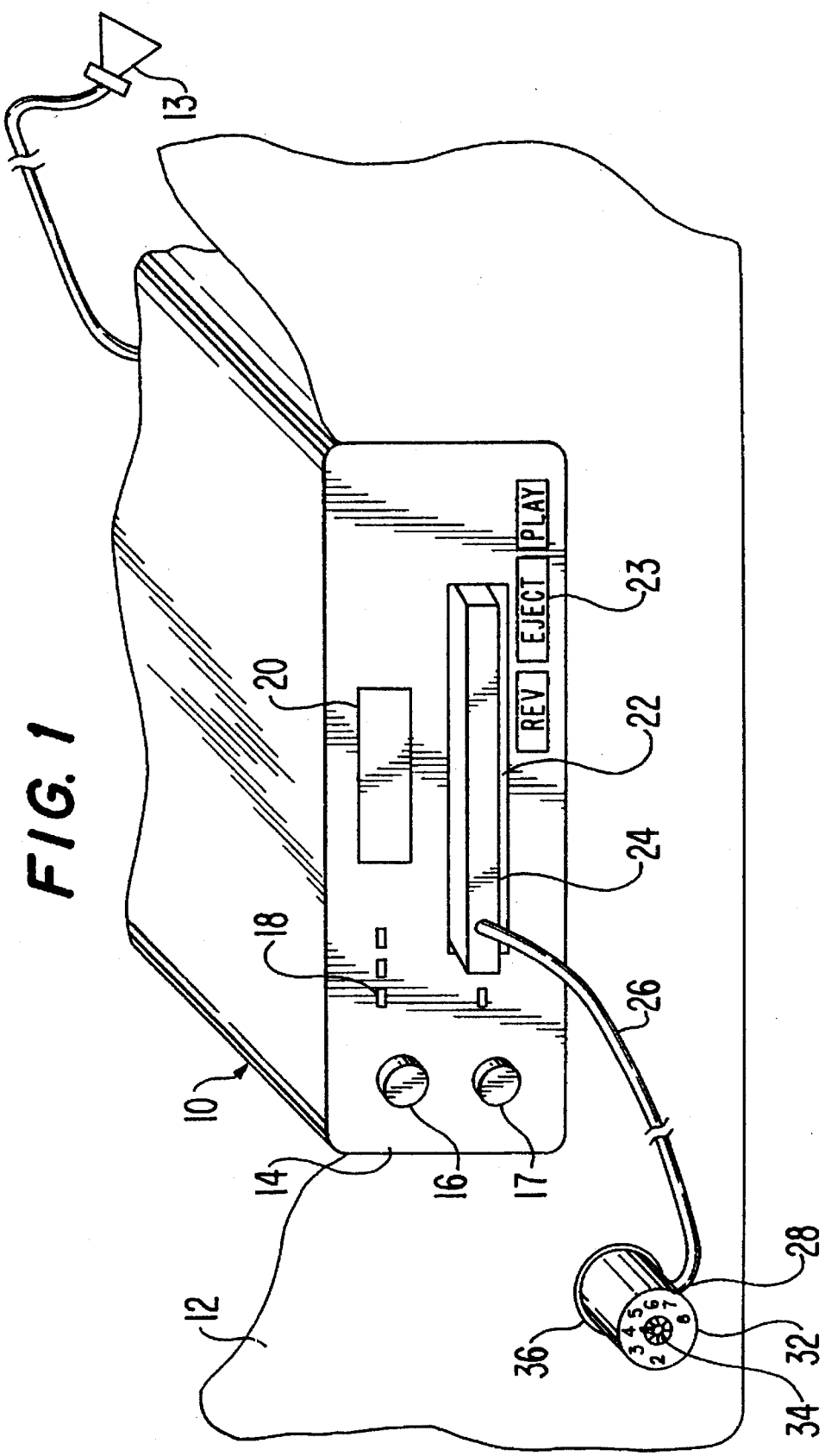
FIG. 1 diagrammatically illustrates a tape player system mounted, as an example, in a dashboard of an automobile, with the T.V. tuner cassette slightly protruding from the exposed face of the tape player.

FIG. 1 diagrammatically illustrates tape player 10 mounted within, as an example, automobile dashboard 12. The tape player system will further include one or more speakers 13. Tape player 10 includes exposed face 14 with a plurality of control knobs 16, 17 and control buttons. One control button is labeled button 18. When tape player 10 is in a RADIO mode, digital display 20 reveals, at the user's option, the radio frequency of the received radio signal or the time. Additional information may be displayed on digital display 20. Tape player 10 also includes a standard tape cassette opening 22. An audio tape cassette (not shown) may be inserted therein. In the present invention, a T.V. tuner cassette 24 is inserted therein. In the illustrated embodiment, the standard audio tape cassette (not shown) and the T.V. tuner cassette 24, when in a fully operable mode, partially protrudes or extends beyond exposed face 14 of tape player 10. In this fully operable mode, the tape in the cassette would be moved across the magnetic pick-up head internally located within tape player 10.

The T.V. tuner cassette 24 includes a cable 26 which carries, among other things, power to the T.V. tuner cassette 24. A combination cigarette lighter adapter plug and tuner control 32 is disposed at remote end 28 of cable 26. As illustrated in FIG. 1, remote end combination unit 32 includes a tuner control 34 which enables the user to select one of a plurality of T.V. broadcast signals. Further, at the opposite end of remote combination unit 32, a cigarette lighter plug (not shown) is inserted into cigarette lighter outlet 36. Accordingly, power, particularly 12 volt DC, is obtained from the terminals in the cigarette lighter outlet. This power is coupled, via the cigarette lighter plug and cable 26, to the T.V. tuner cassette 24.

In operation, the user selects a particular T.V. channel from tuner control 34. Power is coupled from the cigarette lighter outlet 36 and cable 26 to the T.V. tuner cassette 24. After selection of the T.V. signal frequency, the user adjusts the volume of the audio system by positioning one of the controls 16 and 17 in tape player 10. When the user wants to disconnect the T.V. tuner cassette, he or she depresses EJECT control 23 on the front face 14 of tape player 10.

Figure 2:
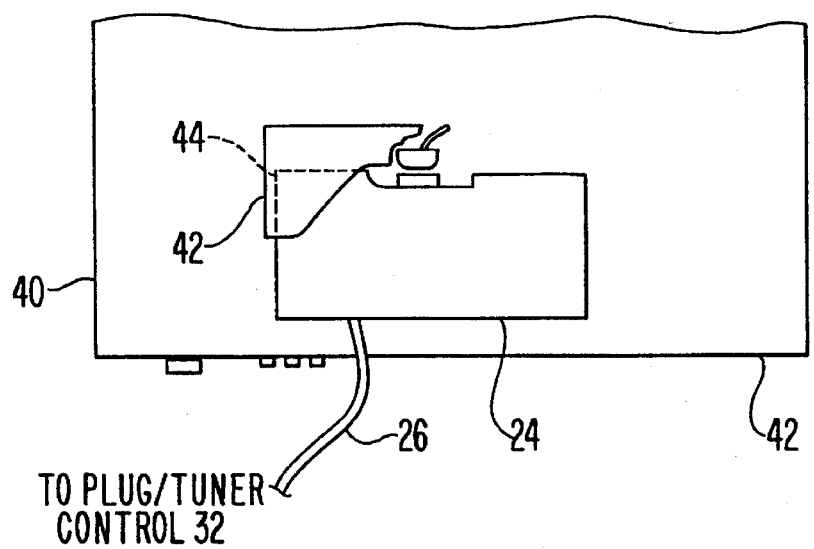
FIG. 2 diagrammatically illustrates another embodiment of a tape player wherein the T.V. tuner cassette is fully inserted and captured within the body of the tape player.

FIG. 2 diagrammatically illustrates a broken away, partial, top view of a tape player 40. Tape player 40 includes a rotatable cassette mount unit 42 (described later) which captures inboard end region 44 of the T.V. tuner cassette 24. In this embodiment, a standard tape cassette (not shown) is completely encapsulated and captured within tape player 40. In other words, the standard audio tape cassette is significantly inboard and disposed away from front face 42 of tape player 40. In the embodiment illustrated in FIG. 2, combination power and control cord 26 extends through an opening in from face 42 similar to opening 22 in FIG. 1. The T.V. tuner is enclosed within the illustrated tape player.

Figure 3:
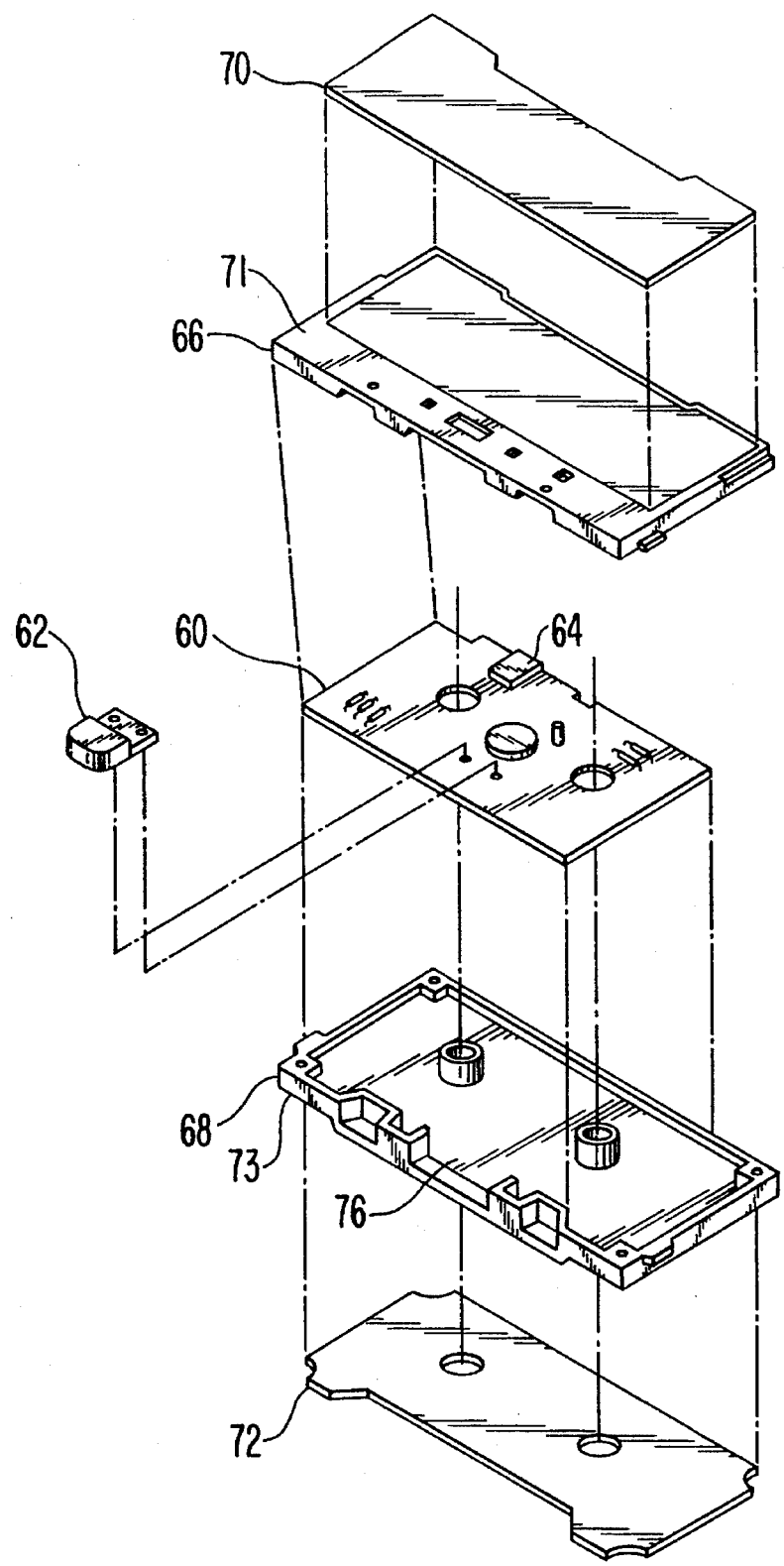
FIG. 3 diagrammatically illustrates an exploded view of the T.V. tuner cassette.

FIG. 3 diagrammatically illustrates an exploded view of the T.V. tuner cassette. Substantially all of the electronics and the electrical devices of the T.V. tuner cassette are mounted on printed circuit board 60. In addition to common T.V. signal demodulators, filters, preamplifiers, etc., the board includes a signal conditioner and an inductive transmitter 62. Transmitter 62 is placed near the magnetic pick-up head (discussed later in conjunction with FIG. 6) of the standard tape player. In addition to the small inductive transmitter 60 (which most likely is one or more coils), a pin connector 64 is mounted on printed circuit board 60. Pin connector 64 enables an electrical connection with the combination and power and tuner control cable 26 illustrated in FIGS. 1 and 2. Printed circuit board 60 is encased between top and bottom insulative bodies 66 and 68. For decoration, the T.V. tuner cassette may include additional coverings 70 and 72 which are respectively mounted to the top surface 71 and the bottom surface 73 of top and bottom members 66 and 68. The T.V. tuner cassette also includes an inboard opening 76 within which is disposed the inductive transmitter 62.

Figure 4:
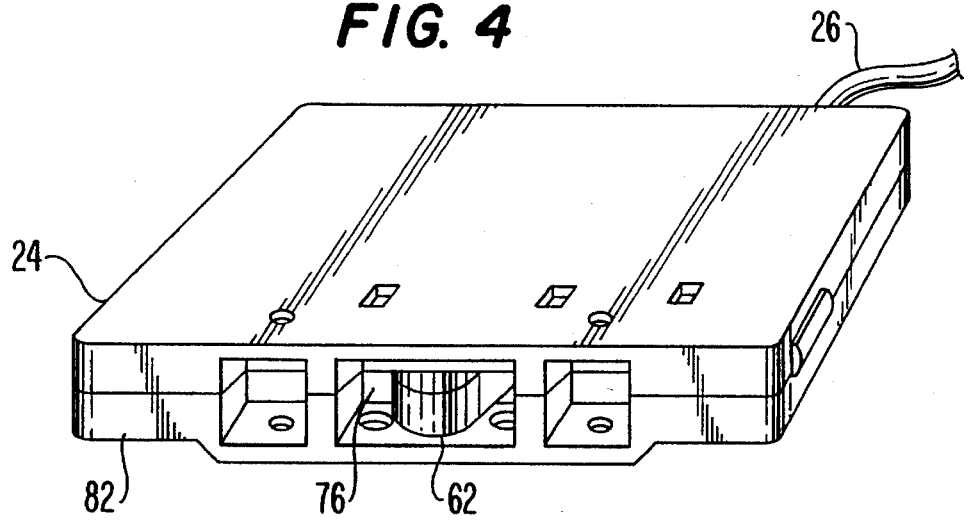
FIG. 4 diagrammatically illustrates the assembled T.V. tuner cassette.

FIG. 4 diagrammatically illustrates the assembled T.V. tuner cassette 24. As shown, the T.V. tuner cassette is shaped and sized to be equivalent to the standard audio cassette tapes utilized by many consumers in tape players. In addition, opening 76 on the inboard face 82 of T.V. tuner cassette 24 reveals the position of inductive transmitter 62. The transmitter is disposed within or slightly behind the plane defined by inboard surface 82 of T.V. tuner cassette 24. Extending from the opposite side of inboard face 82 is the combination power and tuner control cable 26.

FIG. 5 diagrammatically illustrates a block diagram of the major electronic components of the T.V. tuner cassette. In the preferred embodiment, electrical connectors, generally designated as connectors 110, are disposed in a generally flat cable (illustrated in conjunction with FIG. 9). At one end of the cable, a cigarette lighter plug 112 is disposed which electrically connects to the 12 volt direct current (DC) power supply commonly associated with automobiles and with cigarette lighter outlets. This DC power is applied to a simple filter 114 and is fed to various power inputs of the electronic circuits in the T.V. tuner cassette. The circuits are mounted on the printed circuit board 60 (FIG. 3) which is diagrammatically illustrated as unit 116 in FIG. 5. In addition, the remote end of the combination power and tuner control cable, embodying conductors 110, includes a user actuated tuner control 118. In a preferred embodiment, the combination power and tuner control cable includes an antenna 120. This antenna may be integral with the power conductors one of which is associated with conductor group 110.

A demodulator 112 is mounted on printed circuit board. The board is illustrated as unit 116 in FIG. 5. The demodulator demodulates the received T.V. broadcast signals and particularly demodulates the audio components of those signals. The demodulated audio component is fed to a preamplifier 124. The output of the preamplifier is applied to a signal conditioning circuit 126 before being applied to inductive transmitter 128. The inductive transmitter 128 converts the demodulated audio T.V. signals into representative electromagnetic (e.m.f.) signals which are diagrammatically illustrated as signals 130 in FIG. 5. These electromagnetic signals are applied to the magnetic head of the tape player shown in FIG. 6.

Figure 6:
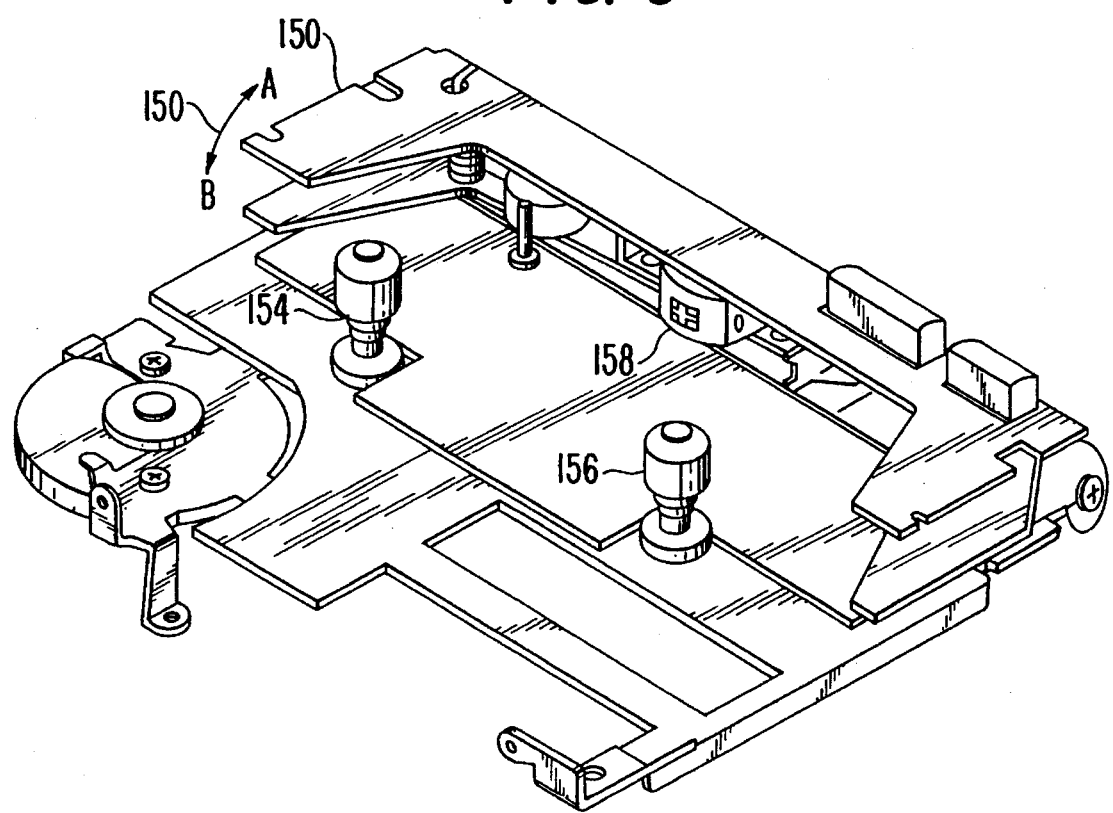
FIG. 6 is an exemplary illustration of one type of tape player.

FIG. 6 diagrammatically illustrates the internal components of one type of tape cassette player. The T.V. tuner cassette slides into rotatable mount 150. This rotatable mount moves angularly in direction A and direction B as shown by double headed arrow 152. In the operative mode, one end of the tape cassette (whether audio or T.V. tuner) is captured by mount 150 and the tape player rotates the mounted cassette downward in direction A to engage capstans 154 and 156. If a standard audio cassette is utilized, one of these capstans or possibly both of these capstans rotate thereby moving the tape across magnetic pick-up head 158. In the present invention, the rotating capstans 154 and 156 do not move any component in the T.V. tuner cassette unless a simple bushing is provided in the tuner cassette. More importantly, the inductive transmitter 128 in FIG. 5 and 62 in FIG. 3 is placed adjacent magnetic pick-up 158. The magnetic pick-up head 158 captures the representative electromagnetic waves which embody the demodulated audio component of the T.V. signal. Upon receipt of the demodulated audio T.V. signal, magnetic head 158 applies this signal to other electrical components in the tape player. For example, the tape player system would include further amplifiers affected by user controls 16 and 17 (FIG. 1) and other signal conditioners. The amplified audio signal is applied to speakers. In the release mode, the user depresses eject button 23 (FIG. 1) and mount 150 moves towards direction B. This movement disengages the inductive transmitter 128 (FIG. 5) and 62 (FIG. 3) thereby permitting the user to withdraw the T.V. tuner cassette from tape player.

Figure 7:
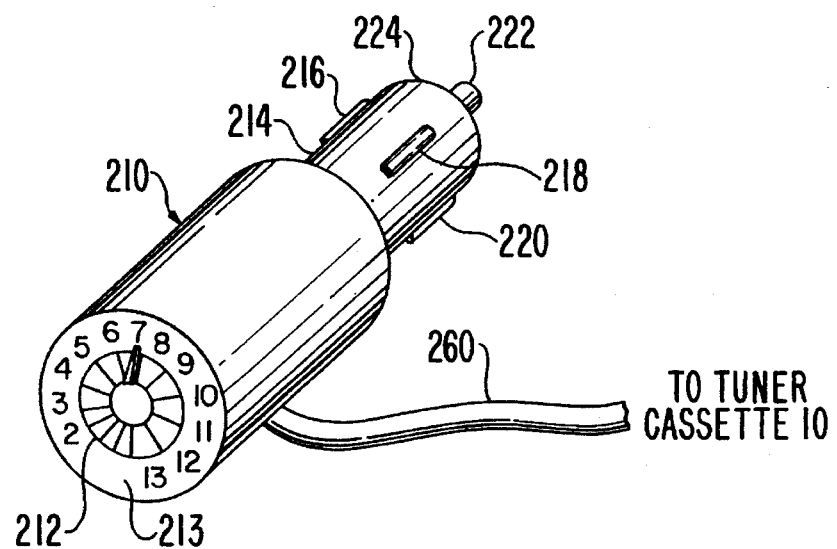
FIG. 7 diagrammatically illustrates the combination cigarette lighter plug and tuner control.
Figure 8:
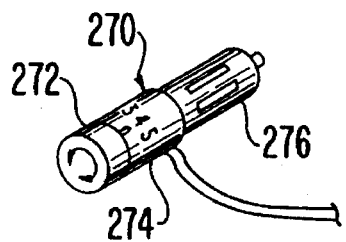
FIG. 8 diagrammatically illustrates another embodiment of the combination cigarette lighter and tuner control; and, FIG. 9 diagrammatically illustrates one embodiment of the power cord embodying power lines, tuner control connectors and an antenna.

FIGS. 7 and 8 diagrammatically illustrate the combination cigarette lighter adapter plug and tuner control. Particularly in FIG. 7, unit 210 includes tuner control 212 permitting the user to select one of a plurality of television signal frequencies. As illustrated in FIG. 7, these frequencies are identified as channels 2 . . . 13. Of course, these channels could be identified based upon the actual frequencies rather than the channel assignment customarily displayed by the television stations. The tuner control normally extends outboard from the dash 12 (FIG. 1) whereas the cigarette lighter plug 214 extends inboard. The cigarette lighter plug customarily includes a plurality of conductive pick-ups 216, 218 and 220. These pick-ups are coupled to one side of the DC power source. A pick-up button 220 customarily extends from end face 224 of plug 214 and provides the second pick-up for the DC power supply. Further, it may be preferable to include a simple filter located within the combination cigarette lighter plug and tuner control 210. At a minimum, the power connectors and the tuner control connectors are carried by combination power and tuner control cable 260.

FIG. 8 diagrammatically illustrates another embodiment of the combination cigarette lighter plug and tuner control 270. In this embodiment, the tuner control 272 is embodied as a cylinder having the same diameter as the body 274 of the cigarette lighter plug 276. In contrast, FIG. 7 shows a knob 212 extending beyond end face 213 of the combination cigarette lighter plug and tuner control body 210.

Figure 9:
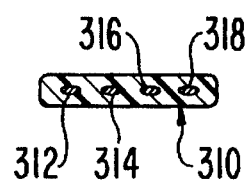

FIG. 9 diagrammatically illustrates the combination power and tuner control cable 310. As shown, this cable is a flat cable having a generally rectangular cross-sectional shape. A plurality of conductors 312, 314, 316 and 318 are captured within the insulative body of the combination cord 310.

The claims appended hereto are meant to cover modifications and changes within the spirit and scope of the present invention.

What is claimed is:

1. A television signal tuner for receiving and demodulating an audio component of a broadcast television signal, said tuner adapted to be inserted into a tape cassette player and adapted to be powered by a cigarette lighter outlet, said tape player having a magnetic pick-up head, said tuner comprising:

a casing shaped and sized substantially equivalent to a cassette tape, said casing adapted to be inserted into said tape player and be substantially encased within said tape player;

a demodulation circuit disposed within said casing, said demodulator adapted to receive and demodulate said audio component of said television signal;

an inductive transmitter disposed within said casing and electrically connected to said demodulation circuit to receive demodulated television audio signals, said inductive transmitter adapted to transmit electromagnetic signals representative of said demodulated television audio signals to said magnetic head in said tape player when said inductive transmitter is adjacent said magnetic head;

a cigarette lighter adapter plug adapted to be inserted into said cigarette lighter outlet and obtain electrical power therefrom;

a tuner control mounted on said cigarette lighter adapter plug, said tuner control permitting selection by a user of one of a plurality of broadcast television signals; and, a cable having multiple electrical conductors therein and extending from said adapter plug to said casing encased within said tape player, corresponding conductors coupling said cigarette lighter adapter and said tuner control with said demodulator circuit to supply power and a tuner control signal respectively thereto.

2. A television signal tuner adapted to be inserted into a tape player as claimed in claim 1 wherein said cable includes an antenna wire electrically coupled to said demodulator and extending beyond said tape player for receiving said broadcast television signals.

3. A tuner as claimed in claim 1 wherein said cable is a flat cable.

4. A tuner as claimed in claim 1 wherein said timer control includes indicia indicating the selected broadcast television signal.

5. A method of receiving, demodulating and audibly announcing an audio portion of a broadcast television signal via a tape cassette player system having a magnetic pick-up head, the method comprising the steps of:

capturing said broadcast television signals at a position exterior to said tape player;

channelling and demodulating the audio portion of the captured television signals locally within said tape player;

inductively transferring the demodulated audio portion of the television signal to said magnetic pick-up head;

audibly announcing the audio portion of said television signal via the tape player system; and obtaining electrical power for the channelling and demodulation step from a location remote from said tape player.

6. A method as claimed in claim 5 including the step of permitting a user to select one of a plurality of broadcast television signals from said location remote from said tape player.

\* \* \* \* \*